(12) United States Patent
Lee et al.

(10) Patent No.: US 9,606,455 B2
(45) Date of Patent: Mar. 28, 2017

(54) SCAN AND STEP EXPOSURE SYSTEM

(71) Applicant: MIDAS SYSTEM CO., Ltd., Daejeon (KR)

(72) Inventors: Gon-Chul Lee, Daejeon (KR);
Heung-Ki Min, Daejeon (KR);
Jun-Hyeong Lee, Daejeon (KR);
Jae-Geun Jeon, Daejeon (KR)

(73) Assignee: MIDAS SYSTEM CO., LTD., Daejeon (KR)

( * ) Notice: Subject to any disclaimer, the term of this patent is extended or adjusted under 35 U.S.C. 154(b) by 14 days.

(21) Appl. No.: 14/888,233

(22) PCT Filed: May 20, 2015

(86) PCT No.: PCT/KR2015/005048
§ 371 (c)(1),
(2) Date: Oct. 30, 2015

(87) PCT Pub. No.: WO2016/010249
PCT Pub. Date: Jan. 21, 2016

(65) Prior Publication Data
US 2016/0161853 A1    Jun. 9, 2016

(30) Foreign Application Priority Data
Jul. 16, 2014  (KR) ........................ 10-2014-0089707

(51) Int. Cl.
*G03B 27/42*  (2006.01)
*G03F 7/20*  (2006.01)

(52) U.S. Cl.
CPC ............ *G03F 7/707* (2013.01); *G03F 7/7035* (2013.01); *G03F 7/70358* (2013.01); *G03F 7/70808* (2013.01)

(58) Field of Classification Search
CPC ...................................... G03F 7/707
USPC .............................. 355/53, 72, 75
See application file for complete search history.

(56) References Cited

U.S. PATENT DOCUMENTS 5,617,182 A    4/1997  Wakamoto et al.

FOREIGN PATENT DOCUMENTS

| JP | 2003-215782 A | 7/2003 |
|----|---------------|--------|
| KR | 10-2003-0055837 A | 7/2003 |
| KR | 10-2012-0135008 A | 12/2012 |
| KR | 10-1379379 B1 | 3/2014 |

*Primary Examiner* — Peter B Kim
(74) *Attorney, Agent, or Firm* — Rabin & Berdo, P.C.

(57) ABSTRACT

There is provided a scan and step exposure system to enable to perform the exposure on a large-sized subject to be exposed such as a film and a wafer, which was difficult to perform circuit patterning process on at one time, by transferring an exposure module by step feed way or making it moved continuously like scanning way in such way that an exposure subject is adsorbed on a chuck tray drawn out of the system body and the chuck tray is put into the body and placed under a mask holder, and a glass base having a film mask having circuit patterns adsorbed thereon is mounted on the mask holder, and the distance between the glass base and the exposure subject is controlled while moving the mask holder up and down, and the exposure process is performed while moving the exposure module located above the mask holder in the transverse direction continuously by scan way or by step feed way.

5 Claims, 14 Drawing Sheets

SCAN AND STEP EXPOSURE SYSTEM

TECHNICAL FIELD

The present invention relates to a scan and step exposure system to enable to perform the exposure on a large-sized subject to be exposed such as a film and a wafer which was difficult to perform circuit patterning process on at one time while transferring an exposure module by step feed or continuously.

BACKGROUND ART

Semiconductor devices are fabricated by stacking thin films repeatedly in order to form a predetermined circuit pattern on a semiconductor wafer, and a plurality of unit processes are repeatedly performed such as deposition, photolithography, etching, and so on in order to form and laminate thin films.

A photolithography process among unit processes is a process of forming patterns on a wafer, and includes steps of photoresist coating, exposure, and developing. By using patterns formed on a wafer through developing process, and etching the uppermost layer of the wafer, devices having a predetermined patterns are formed.

A coater is used in the photoresist coating in which light-sensitive material, photoresist is uniformly applied on the surface of a wafer by using the coater. In the step of exposure, a stepper is used to make light pass through the circuit patterns of the mask so as to expose the circuit patterns on the exposure subject (film, wafer, etc.) having photoresist layer thereon. In the developing process, a developer is used to develop the portions on the surface of the wafer which received light in the exposure process.

Here, for the exposure system to perform the exposure process as prior art of technology, it is recommended Korean Patent Registration No. 1379379, titled 'Wafer Chuck Balancing Apparatus for Stepper'.

All exposure systems including the exposure apparatus in the prior art of technology are structured such that a light source of the exposure module fixedly installed at a position emit light to across the entire surface of the exposure subject located on an exposure stage.

However, since the exposure module is fixedly installed at a position, the size of an exposure subject to be exposed is limited according to the product specifications of an exposure module, and it is impossible to perform exposure by one time on the exposure subject being greater in length than the size reference of the exposure module. Therefore, the availability of the exposure systems is decreased, and the size of the exposure module needs to excessively enlarge in order to perform exposure a long-sized exposure subject by one time.

Therefore, it is highly demanded to produce an exposure system having the function to enable expose an exposure subject more efficiently regardless of the size of the exposure subject.

DISCLOSURE

Technical Problem

Therefore, the present invention has been made to solve the above problems, and it is an aspect of the present invention to provide a scan and step exposure system for performing the exposure process more efficiently on a large-sized exposure subject by moving an exposure module successively in scan way or moving in step feed way which is operated such that an exposure subject is adsorbed on a chuck tray drawn out of the system body and the chuck tray is put into the body and placed under a mask holder, and a glass base having a film mask having circuit patterns adsorbed thereon is mounted on the mask holder, and the distance between the glass base and the exposure subject is controlled while moving the mask holder up and down, and the exposure process is performed while moving the exposure module located above the mask holder in the transverse direction continuously by scan way or by step feed way.

Other objects and advantages of the invention will become apparent from embodiments of the invention to be described later. The objects and advantages of the invention can be embodied by means described in the appended claims and combinations thereof.

Technical Solution

In accordance with the present invention, the above and other aspects can be accomplished by providing a scan and step exposure system comprising: a chuck tray capable to be drawn in and out of an exposure body by the operation of the chuck tray driving cylinder located inside the front side of the exposure body, a mask holder located above the chuck tray and moving up and down by the operation of the exposure module elevating cylinder, and an exposure module located above the mask holder and moving in the transverse direction by the operation of the exposure module transfer motor so as to perform the exposure on the subject which is placed on the chuck tray by adsorption.

Advantageous Effects

As described above, in accordance with the present invention, the exposure module can move successively by scan way or move step by step repeatedly in the transverse direction regardless of the size or the references of the exposure subject so as to enable perform the exposure on various kinds of exposure subjects in size more uniformly and more efficiently throughout the whole surface, thereby to increase the availability of the exposure system, and provide the effect of large-sized subject to be exposed more fast in time and more easily by small-sized exposure system without the needs of enlarging the exposure module.

Furthermore, a long-sized exposure subject can be placed on the chuck tray and adsorbed thereon one by one in its section since a porous chuck is formed on the chuck tray so that the entire area of the exposure subject can be completely adsorbed on the porous chuck so as to provide high quality exposure results.

DESCRIPTION OF DRAWINGS

These and other aspects and advantages of the present invention will become apparent and more readily appreciated from the following description of the embodiments, taken in conjunction with the accompanying drawings, in which.

Figure 1:
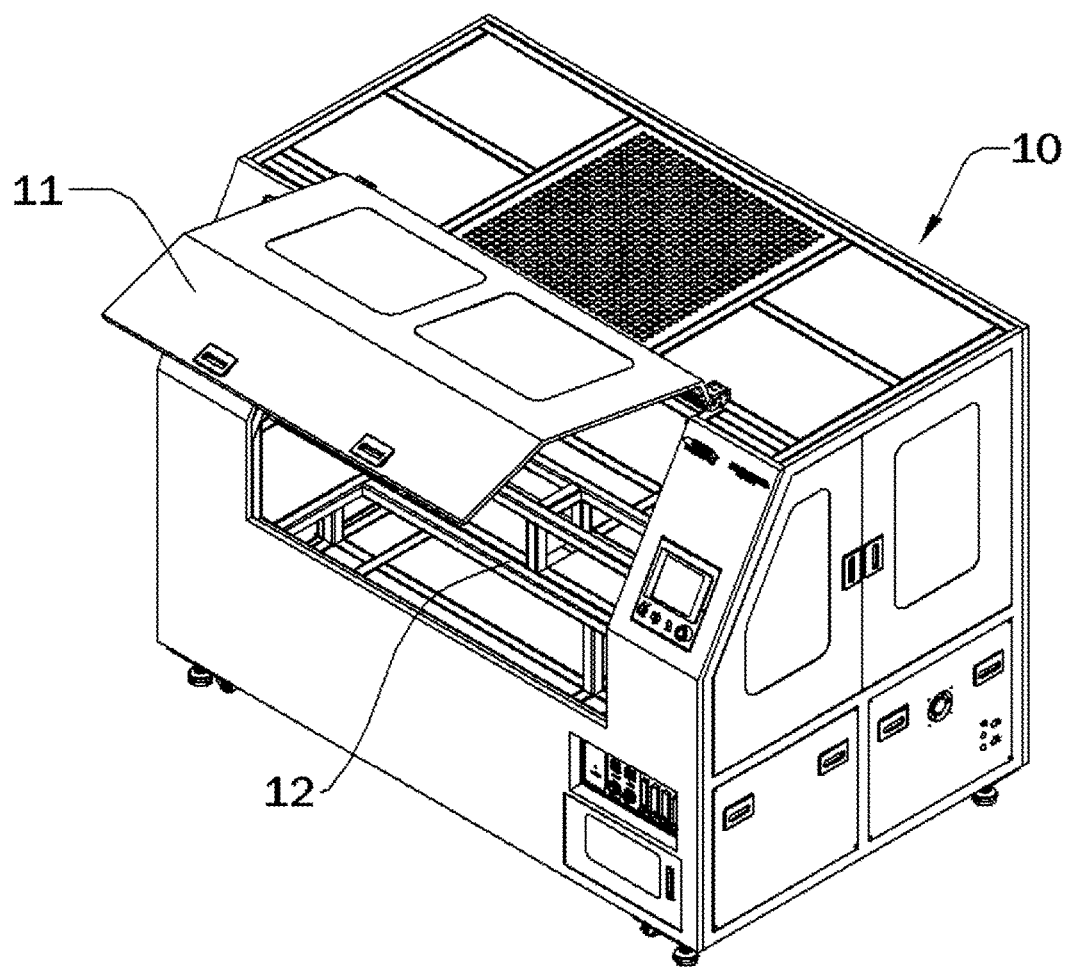
FIG. 1 is a perspective view of a scan and step exposure system according to the present invention.
Figure 2:
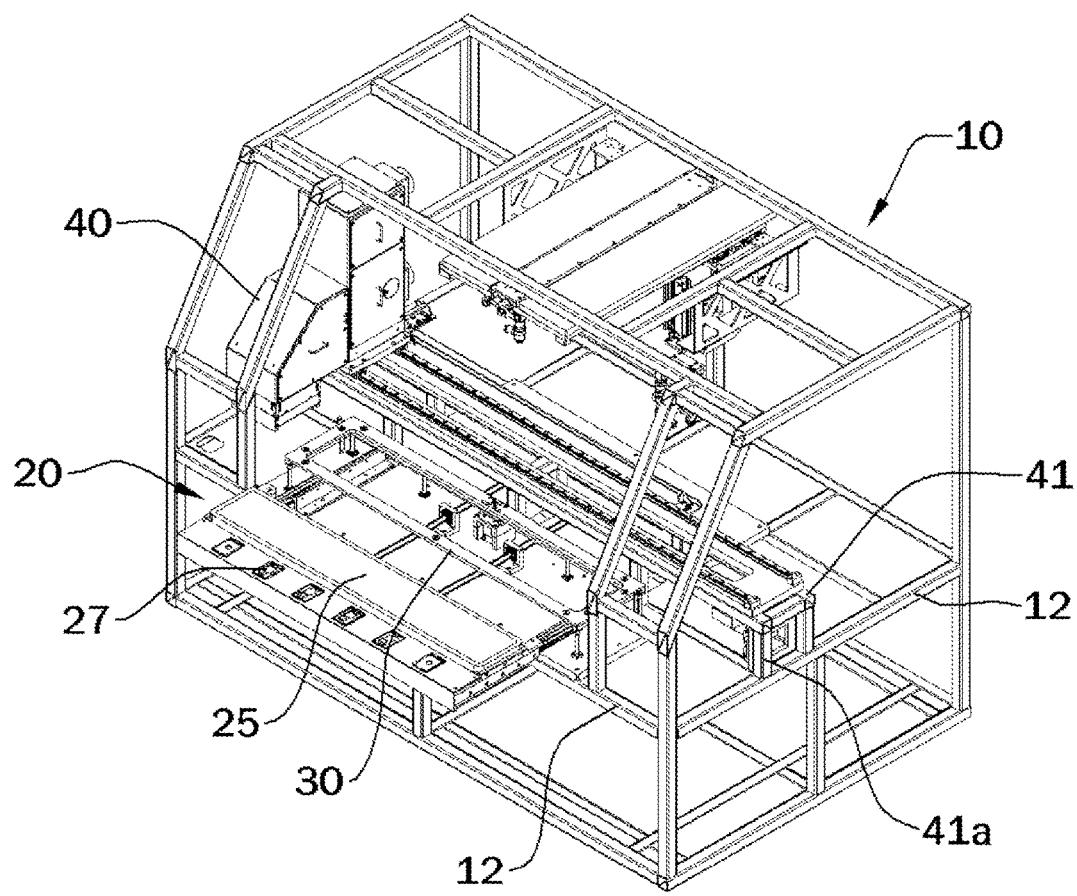
FIG. 2 is a perspective view of a scan and step exposure system with its outer package removed therefrom according to the present invention.

[Brief description of reference numbers of major elements]

| | |
|---|---|
| 1: exposure subject | 2: film mask |
| 10: exposure body | 11: front gate |
| 12: horizontal frame | 20: chuck tray |
| 21: base plate | 22: cylinder fix plate |
| 24: chuck tray driving cylinder | 25: porous chuck |
| 26: fixed rail | 28: driving rail |
| 30: mask holder | 31: guide rod |
| 32: holder elevating cylinder | 40: exposure module |
| 41: exposure module support frame | 42: rail support |
| 42a: path | 43: LM rail |
| 44: carrier | 46: ball screw axis |
| 47: ball nut | 48: exposure module transfer motor |
| 49: timing belt | 50: glass base |
| 51: vacuum line | 52: vacuum port |

BEST MODE

The present invention to achieve the above aspects has the characteristics as follows:

In accordance with an embodiment of the present invention, there is provided a scan and step exposure system comprising: an exposure body having a front gate selectively being open or closed; a chuck tray having a base plate and a cylinder fix plate spaced from each other at the front and the rear inside the exposure body, and a pair of chuck tray driving cylinder placed across between the base plate and the cylinder fix plate, and a porous chuck placed to be drawn into or out of the exposure body while movable by the chuck tray driving cylinder and sliding along fixed rails fixed at both sides of the base plate; a mask holder being integrally connected with a plurality of guide rods installed on every sides of the base plate to pass through, and selectively moving up and down on the chuck tray by a holder elevating cylinder provided at the middle rear side of the base plate; and an exposure module sliding along LM rails attached to the top of a rail support installed behind the mask holder in the transverse direction, and enabling to move by scan way or move by step feed in the transverse direction by an exposure module transfer motor, and perform the exposure on an exposure subject placed by adsorption on the chuck tray.

Mode for Invention

The present invention will now be described more fully hereinafter with reference to the accompanying drawings, in which preferred embodiments of the invention are shown.

It will be understood that words or terms used in the specification and claims shall not be interpreted as the meaning defined in commonly used dictionaries. It will be further understood that the words or terms should be interpreted as having a meaning that is consistent with their meaning in the context of the relevant art and the technical idea of the invention, based on the principle that an inventor may properly define the meaning of the words or terms to best explain the invention.

As used herein, the singular forms "a", "an" and "the" are intended to include the plural forms as well, unless the context clearly indicates otherwise.

The present invention may be embodied in different forms and should not be construed as limited to the embodiments set forth herein. Rather, these embodiments are provided as teaching examples of the invention. Therefore, it will be understood that the scope of the invention is intended to include various modifications and alternative arrangements within the capabilities of persons skilled in the art using presently known or future technologies and equivalents.

The scan and step exposure system according to an embodiment of the present invention will be described with reference of drawings. In schematic view, the scan and step exposure system of the present invention includes an exposure body 10, a chuck tray 20, a mask holder 30, and an exposure module 40.

Hereinafter, the scan and step exposure system of the present invention will be described in more detail with embodiments.

A front gate 11 is installed in the exposure body 10 to enable open and close the exposure body 10 such that the chuck tray 20 is input toward inside or drawn out toward outside, and a glass base 50 is mounted on the top of the mask holder 30 installed inside the exposure body 10.

A plurality of horizontal frames 12 are installed at the middle inside the exposure body 10 with connected to each other, and a base plate 21 and a cylinder fix plate 22 are respectively located at the front and the back on the horizontal frames 12 with distanced from each other, and cylinder brackets 23 and 23a are fixedly installed on the base plate 21 and the cylinder fix plate 22 respectively at the middle thereof. A pair of chuck tray driving cylinders 24 are provided with held by the cylinder brackets 23 and 23a at both ends. A porous chuck 25, which is connected with a piston road 24a of the chuck tray driving cylinder 24, moves while sliding by the chuck tray driving cylinders 24 along the fixed rails 26 fixed at both sides on the base plate 21, which is shown as in FIGS. 4 and 5, so that the porous chuck 25 is free to move in and out of the exposure body 10.

A plurality of operation switches 27 are located at the front portion on the chuck tray 20, and behind the operation switches 27, the porous chuck 25 is mounted in order to fixedly hold an exposure subject 1 by vacuum adsorption for exposure process. Driving rails 28 are integrally attached to the both sides of the bottom of the porous chuck 25 to be connected to the fixed rails 26 so that the chuck tray 20 slides smoothly back and forth.

In the case that the exposure subject 1 is adsorbed on the porous chuck 25 by applying vacuum adsorption at one time since the porous chuck 25 is shaped as rectangle being long in its length, it is risky that the large-sized exposure subject 1 is not vacuum-adsorbed uniformly in its entire surface, thereby causing the exposure subject 1 to come off from the porous chuck 25 or be distorted in its position. In order to address the problem, the porous chuck 25 is applied into a plurality of division sections along the left and right directions and the exposure subject 1 is put to be mounted on the porous chuck 25 each by each division section with time apart so that the exposure subject 1 is completely adsorbed by vacuum adsorption on the porous chuck 25 throughout its surface, thereby provide the effective results for the exposure in high quality.

The mask holder 30 is located above the base plate 21 and is installed to enable move up and down selectively. A plurality of guide rods 31 are located between the mask holder 30 and the base plate 21 to be distanced from each other and to pass through the base plate 21. The mask holder 30 in rectangular shape is integrally connected to the top ends of the guide rods 31. A piston rod 32a of a holder elevating cylinder 32, which is installed at the middle back location on the base plate 21, is integrally connected to the bottom of the mask holder 30 so that the mask holder 30 is installed to move up and down selectively by the holder elevating cylinder 32 above the chuck tray 20.

Therefore, the difference in height distanced between the film mask 2, which is held with safely mounted on the mask holder 30, and the exposure subject 1, which is adsorbed on the porous chuck 25, can be controlled to the optimum state easily and effectively, thereby to bring the better results on the exposure process.

The film mask 2 includes circuits patterns formed thereon. More application of technology can be added without directly mounting the film mask 2 on the mask holder 30, by applying the technology of adsorbing the film mask 2 on the bottom of a glass base 50 safely mounted on the mask holder 30 by uniform and close contact way.

As for the constitution by the technology, the glass base 50 is safely mounted on the mask holder 30, a vacuum line 51 is provided in dent on the bottom of the glass base 50 around inside the rectangular periphery. On the glass base 50, a plurality of vacuum ports 52 are provided, going through with the vacuum line 51 and fitted coupled therewith. The film mask 2 having circuit patterns thereon can be closely in flat way contacted to the bottom of the glass base 50 by using vacuum adsorption supplied by the vacuum line 5, thereby greatly enhancing the exposure uniformity.

A plurality of centering lines 53 are formed out of the vacuum line 51 so as to provide the function to easily meet the center of the film mask 2 when fixing the film mask 2 to the glass base 50.

A rail support 42 is installed behind the mask holder 30 in the transverse direction. LM rails 43 is attached to the top of the rail support 42, and the exposure module 40 is coupled with the LM rails 43 such that the exposure module 40 slidably moves along the LM rails 43. The exposure module 40 enables to move by step feed in the transverse direction by an exposure module transfer motor 48, and perform the exposure on the exposure subject 1 placed by adsorption on the chuck tray 20.

For more detailed description about the constitution of the exposure module 40, an exposure module support frame 41 in rectangular shape is installed in the transverse direction over the horizontal frame 12, which is placed in the middle of the exposure body 10 at a level with the bottom of the body. A plurality of support legs 41a, which are attached to the bottom of the exposure module support frame 41 in the vertical direction, are fixed integrally to the horizontal frame 12.

The rail support 42 is installed on the exposure module support frame 41 to be safely mounted thereon, and the LM rails 43 are attached on the rail support 42 and located respectively at the front and rear of the rail support 42 along the longitudinal direction. Carriers 44, which are attached to the front and rear on the bottom of the exposure module 40, are coupled with the LM rails 43 to slidably move along the rails. A ball screw axis 46 is rotationably fitted into the axis brackets 45a, which are formed with attached to the both sides on the bottom of the exposure module support frame 41. At one side of the ball screw axis 46, a ball nut 47, which is attached to the middle of the bottom of the exposure module 40, is screw-coupled while passing through a path 42a formed in the rail support 42.

A motor fix plate 48a is attached integrally to one side of the support leg 41a, and the exposure module transfer motor 48 is installed to the motor fix plate 48a. The motor axis of the exposure module transfer motor 48 and the ball screw axis 46 are connected by a mutual timing belt 49 so that the rotation force generated by the operation of the exposure module transfer motor 48 is transferred to the ball screw axis 46 and while the ball screw axis 46 rotates, the ball nut 47, which is screw-coupled with the ball screw axis 46, is transferred along the ball screw axis 46 so that the exposure module 40 moves along the LM rails 43 in the transverse direction continuously at a time like scanning way, or repeatedly step by step like stepping way. Therefore, the exposure process can be possible on the long-lengthen exposure subject 1 regardless of its size and reference so that the work ranges of the exposure system becomes widen, and the availability of the exposure system becomes maximized.

Figure 3:
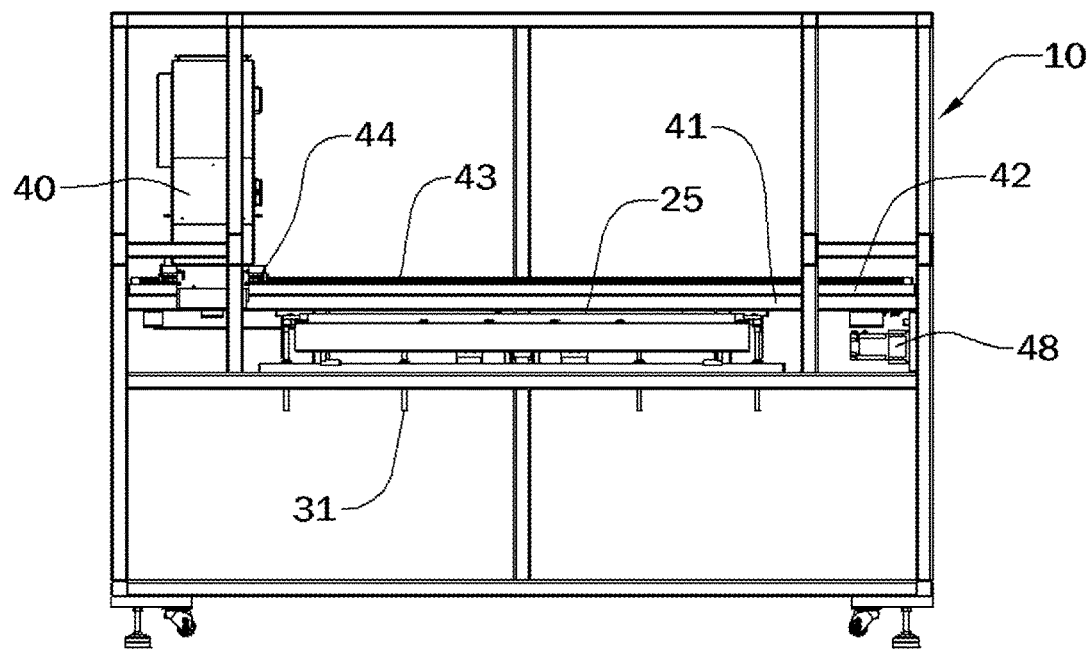
FIG. 3 is a front view of a scan and step exposure system with its outer package removed therefrom according to the present invention.
Figure 4:
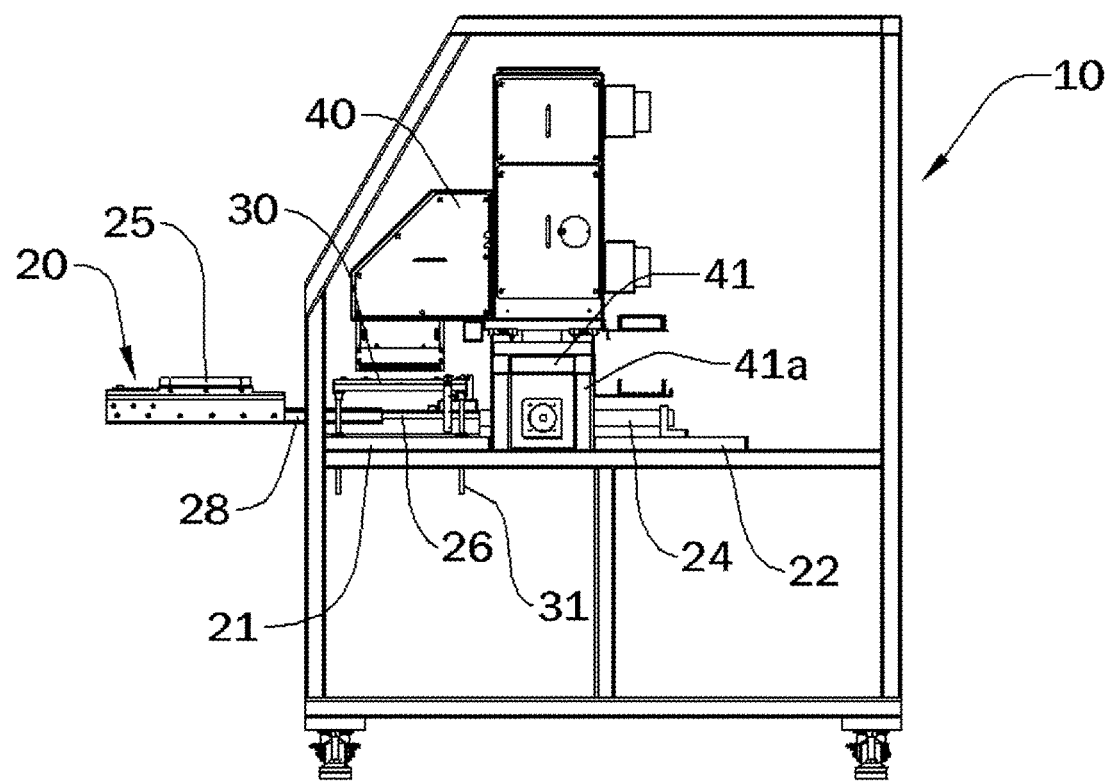
FIG. 4 is a right-side view of a scan and step exposure system with its outer package removed therefrom according to the present invention.
Figure 5:
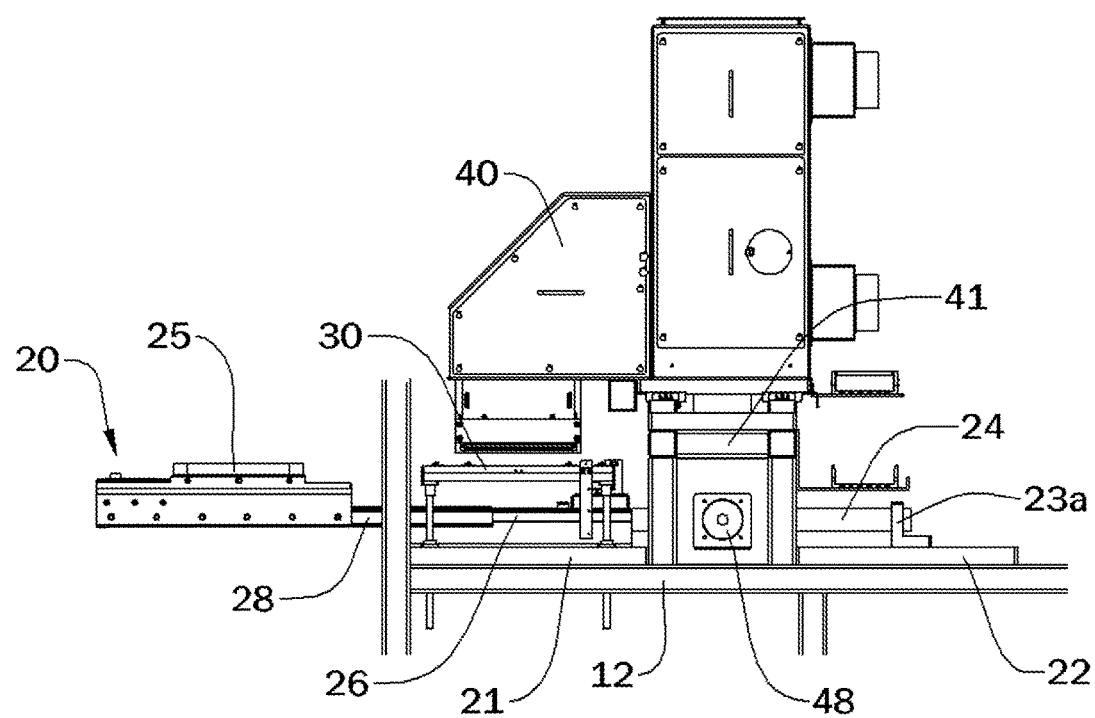
FIG. 5 is a side view of a scan and step exposure system with a chuck tray, a mask holder and an exposure module installed therein according to the present invention.
Figure 6:
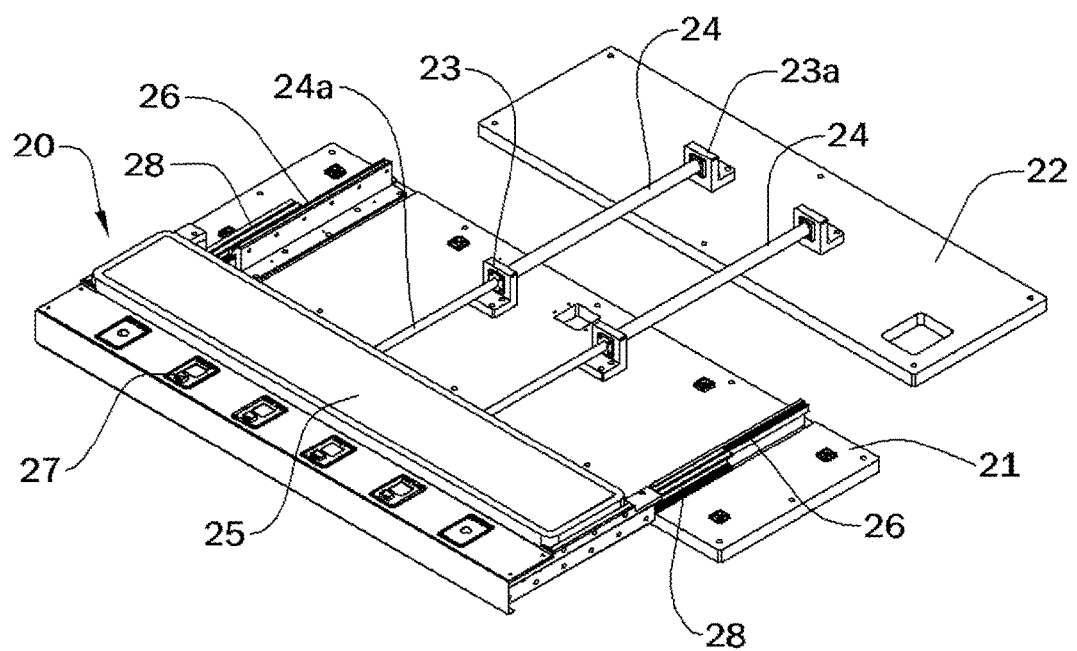
FIG. 6 is a perspective view of a scan and step exposure system with a chuck tray installed therein according to the present invention.
Figure 7:
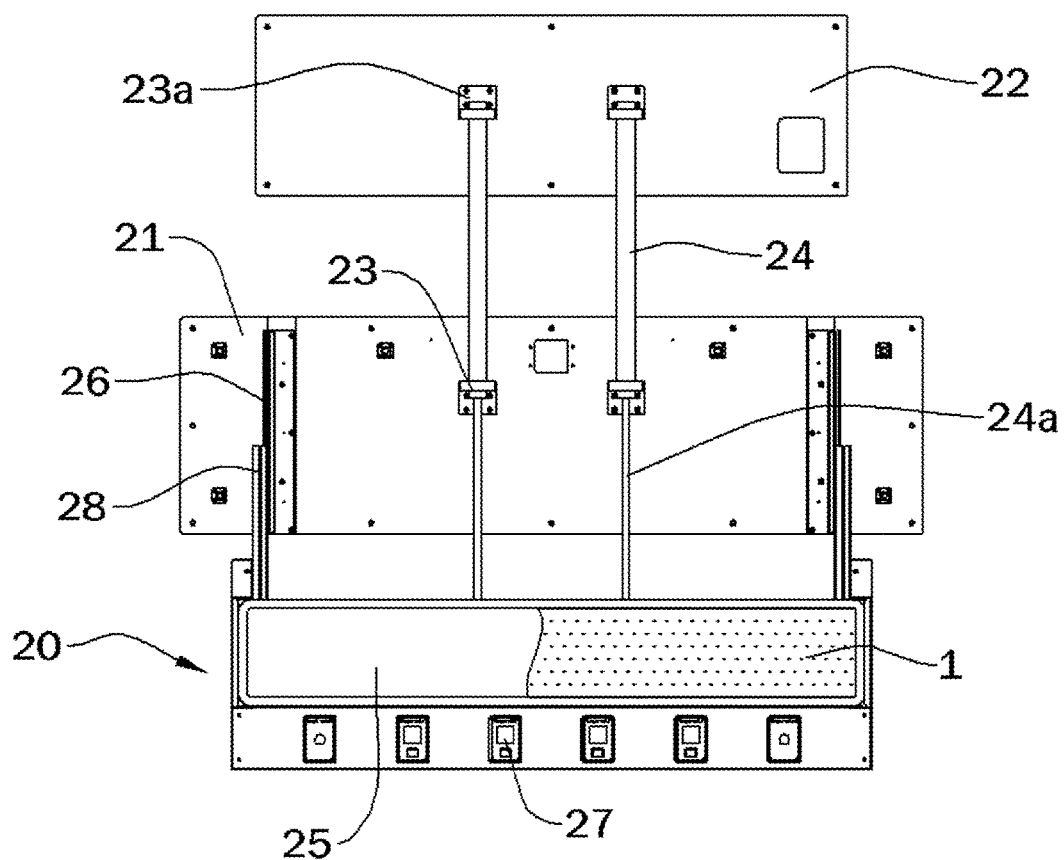
FIG. 7 is a plan view of a scan and step exposure system with a chuck tray drawn therefrom according to the present invention.
Figure 8:
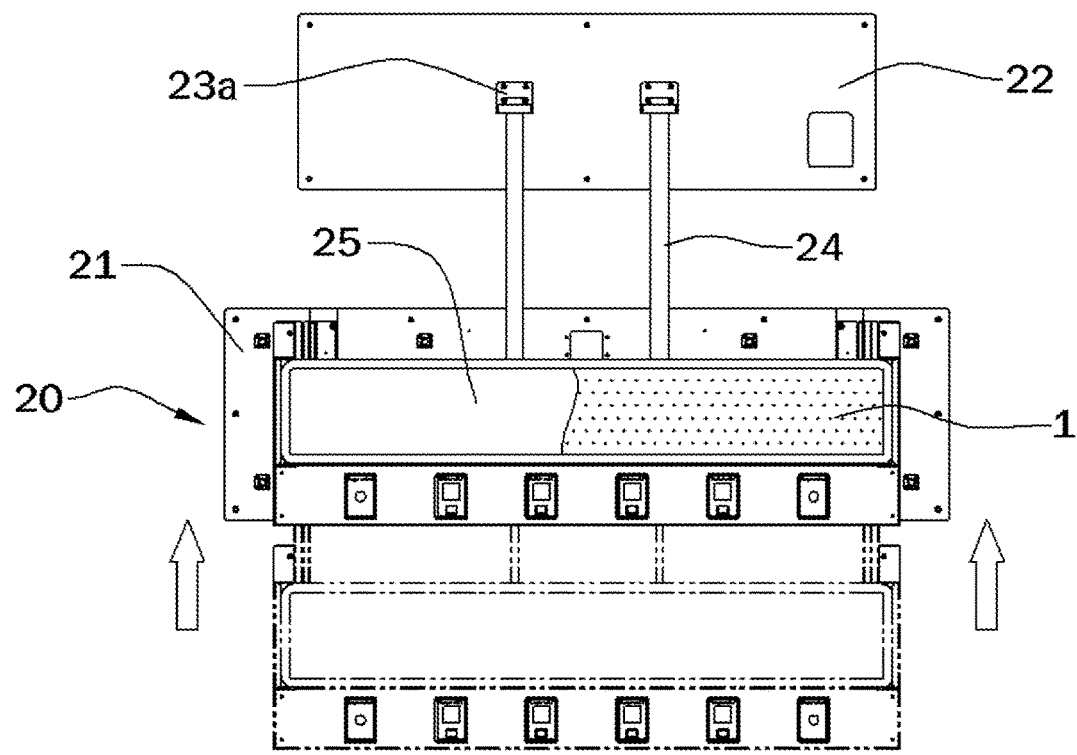
FIG. 8 is a plan view of a scan and step exposure system with a chuck tray being input there into according to the present invention.
Figure 9:
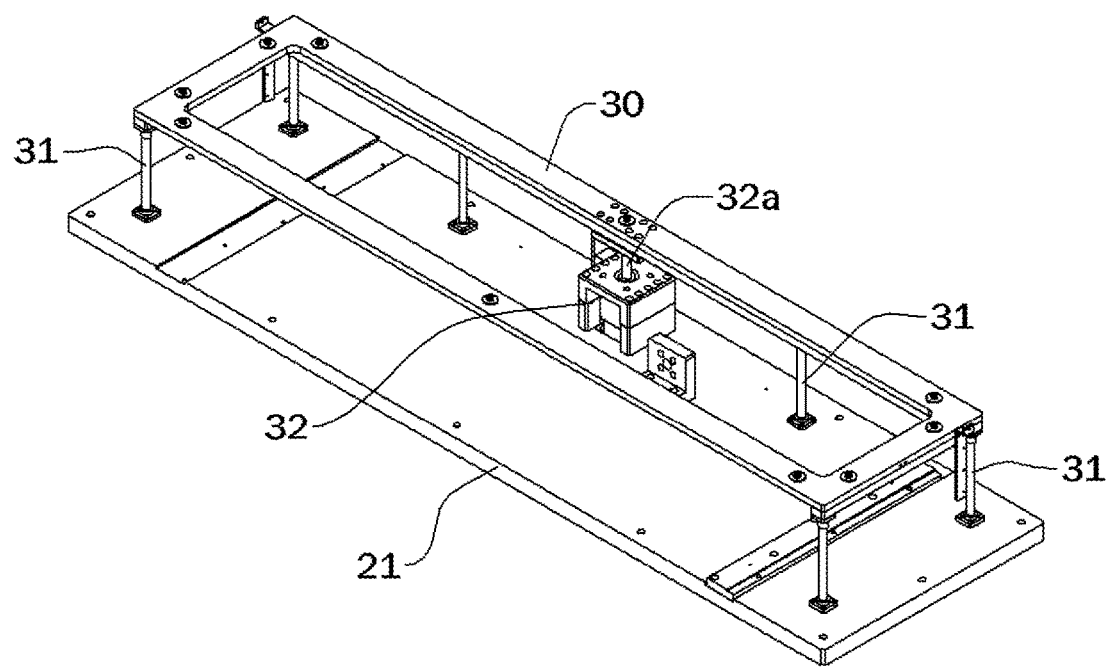
FIG. 9 is a perspective view of a scan and step exposure system with a mask holder installed therein according to the present invention.
Figure 10:
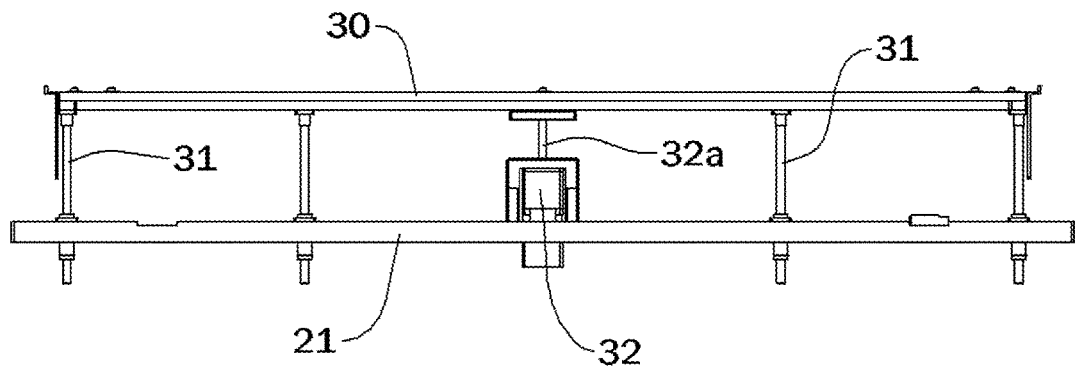
FIG. 10 is a front view of the mask holder according to the present invention.
Figure 11:
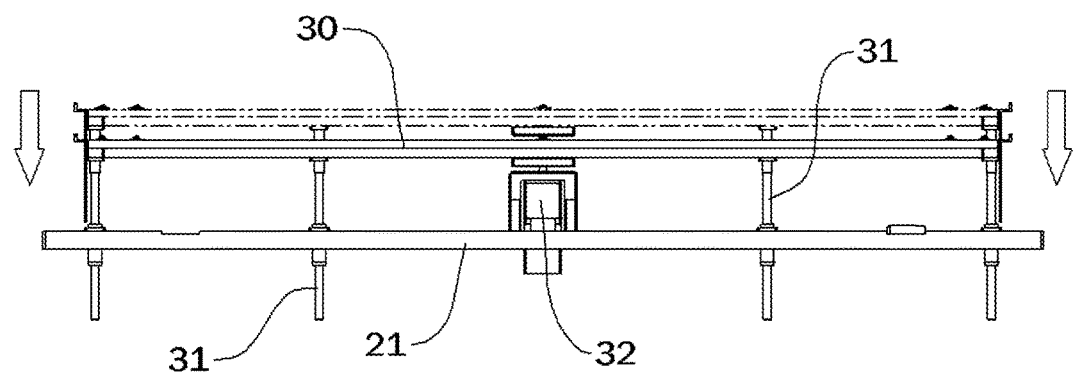
FIG. 11 is a front view of the mask holder descending according to the present invention.
Figure 12:
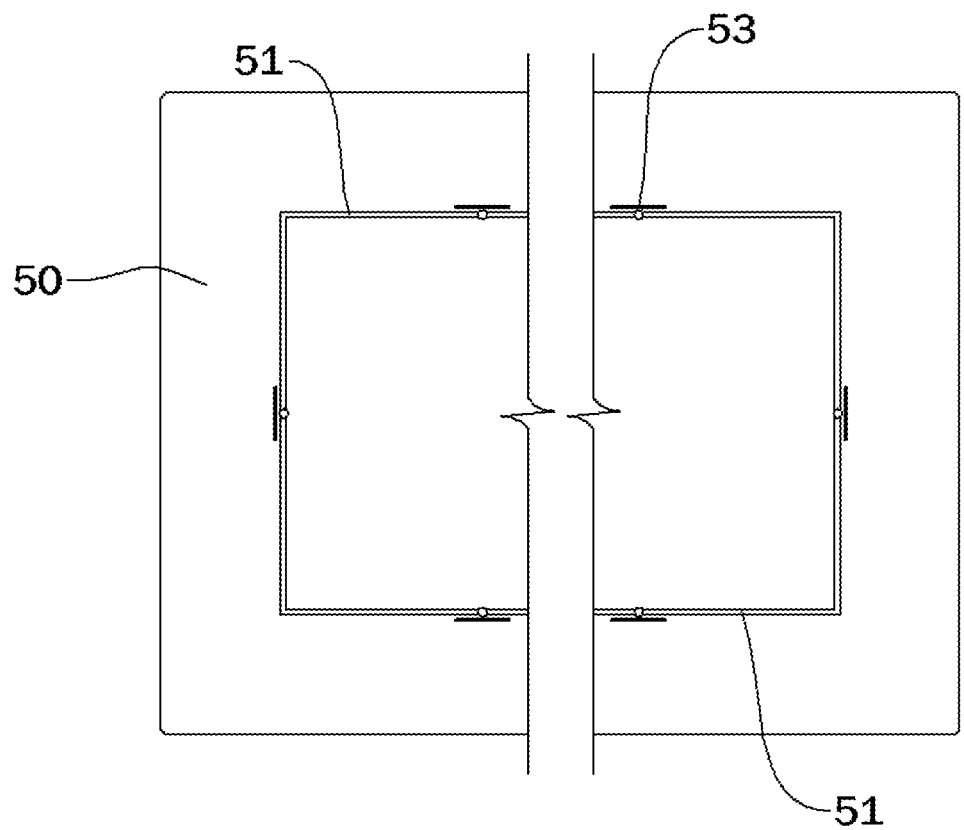
FIG. 12 is a bottom view of a glass base according to the present invention.
Figure 13:
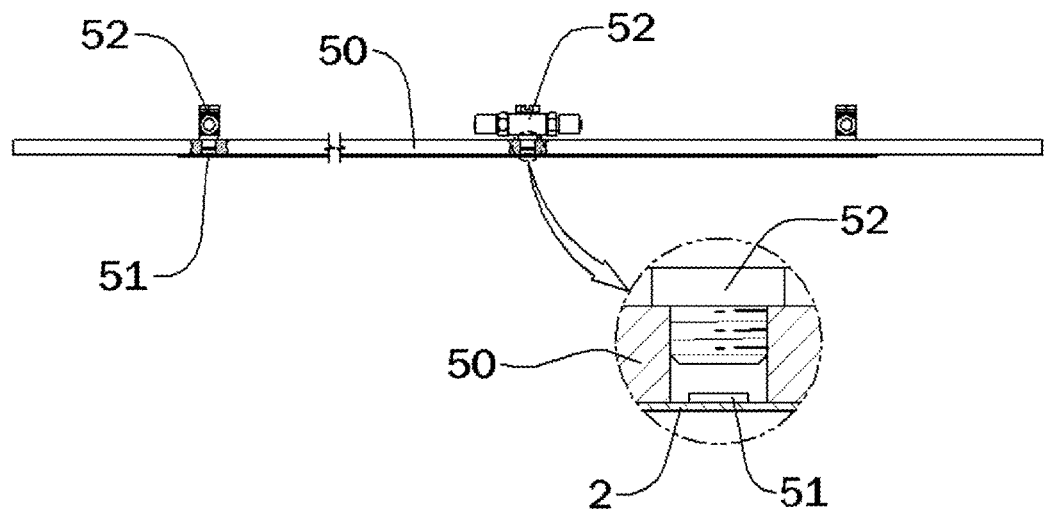
FIG. 13 is a side-sectional view of the glass base according to the present invention.
Figure 14:
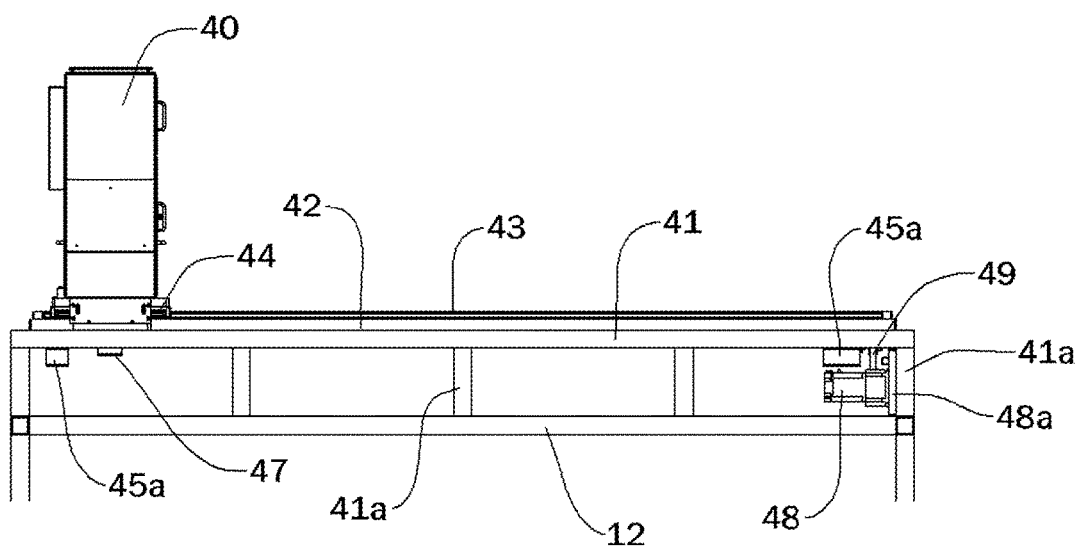
FIG. 14 is a front view of the exposure module installed according to the present invention.
Figure 15:
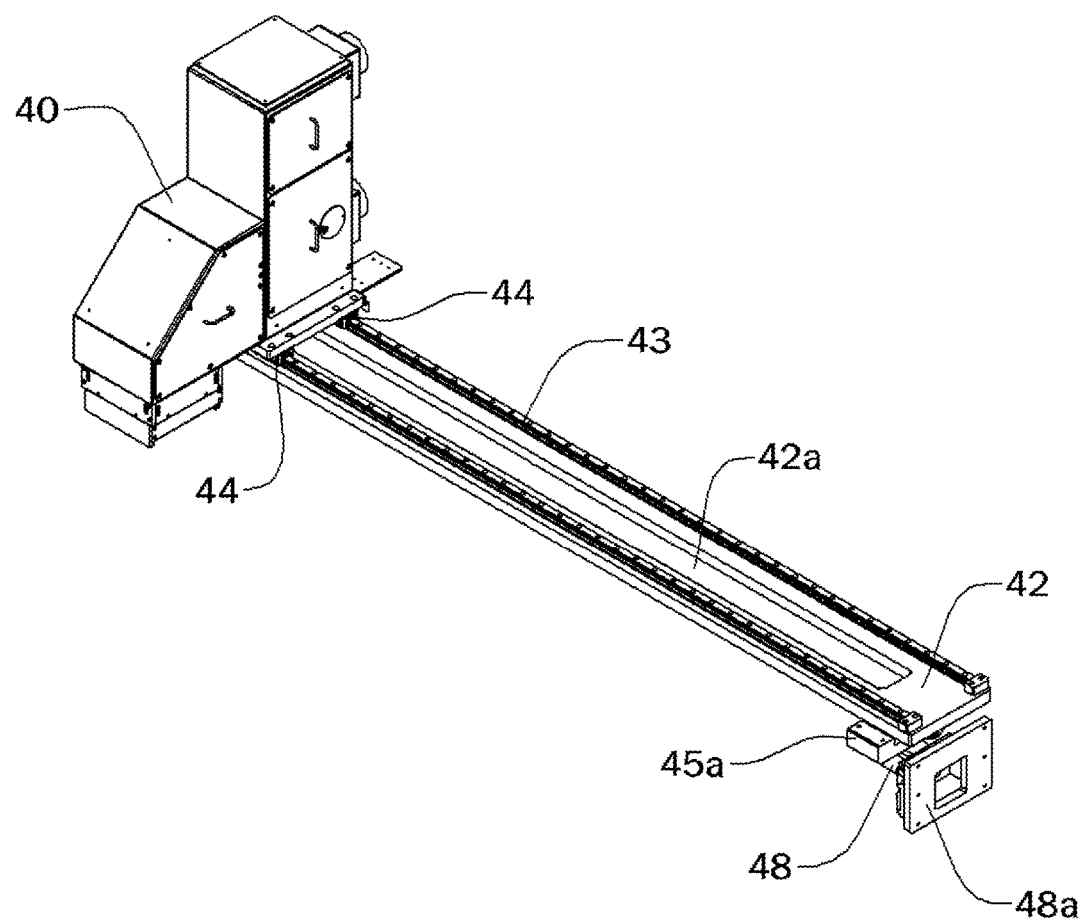
FIG. 15 is a perspective view of the exposure module according to the present invention.
Figure 16:
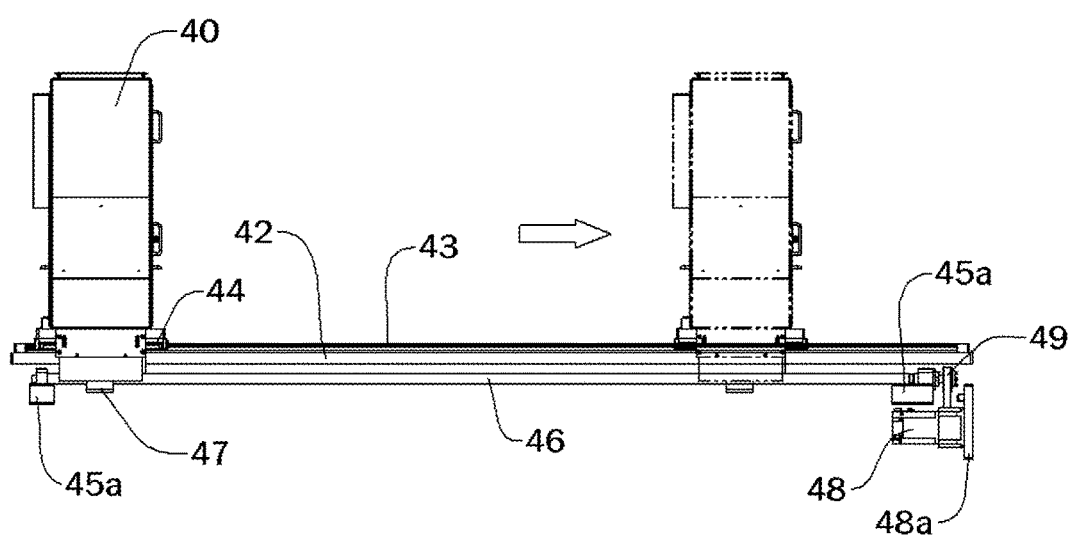
FIG. 16 is a front view of the exposure module in operation according to the present invention.

Now then as shown in FIGS. 3 to 5, by the structural feature of the present invention as described above, the exposure subject 1 to be exposed is placed on the chuck tray 20 with the chuck tray 20 drawn out of the exposure body 10, and safely placed at its location by adsorption, and the chuck tray 20 having the exposure subject 1 adsorbed thereon is moved in by the operation of the chuck tray driving cylinder 24 as shown in FIG. 8 and taken in and placed on the exposure position, that is, under the mask holder 30.

Then, with the glass base 50 turned over, the film mask 2 having circuit patterns formed thereon is safely placed on the bottom of the glass base 50 having the vacuum line 51 formed in dent and fixed thereon by using the vacuum adsorption. The glass base 50 is turned over again with its right top side upward and put to be safely mounted on the mask holder 30. While elevating the mask holder 30 up and down and controlling the distance from the exposure subject 1 maintained good and optimized, the exposure module 40 is driven to step feed so as to perform the exposure process on the long-length exposure subject 1 by step feed way.

While the invention was described above with reference to the finite embodiments and drawings, the invention is not limited to the embodiments but can be modified and changed in various forms by those skilled in the art without departing from the technical concept of the invention and the equivalents of the appended claims.

What is claimed is:

1. A scan and step exposure system comprising:

an exposure body having a front gate selectively being open or closed;

a chuck tray having a base plate and a cylinder fix plate spaced from each other at the front and the rear inside the exposure body, and a pair of chuck tray driving cylinder placed across between the base plate and the cylinder fix plate, and a porous chuck placed to be drawn into or out of the exposure body while movable by the chuck tray driving cylinder and sliding along fixed rails fixed at both sides of the base plate;

a mask holder being integrally connected with a plurality of guide rods installed on every sides of the base plate to pass through, and selectively moving up and down on the chuck tray by a holder elevating cylinder provided at the middle rear side of the base plate; and an exposure module sliding along LM rails attached to the top of a rail support installed behind the mask holder in the transverse direction, and enabling to move by scan way or move by step feed in the transverse direction by an exposure module transfer motor, and perform the exposure on an exposure subject placed by adsorption on the chuck tray.

2. The scan and step exposure system according to claim 1, wherein a plurality of operation switches are located at the front portion on the chuck tray, and behind the operation switches, and driving rails are integrally attached to the both sides of the bottom of the porous chuck to be connected to the fixed rails.

3. The scan and step exposure system according to claim 1, wherein the rail support is installed to be mounted on the exposure module support frame which is rectangular-shaped and is installed in the transverse direction in the middle of the exposure body, and carriers, which are attached to the front and rear on the bottom of the exposure module, are coupled with the LM rails which are attached respectively at the front and the rear of the rail support along the longitudinal direction, a ball screw axis is rotationably fitted into a pair of axis brackets, which are formed with attached to the both sides on the bottom of the exposure module support frame, and a ball nut, which is attached to the middle of the bottom of the exposure module, is screw-coupled at the ball screw axis through a path formed in the rail support, and the exposure module transfer motor is installed to a support leg, which is attached to one side of the bottom of the exposure module support frame, and the exposure module transfer motor transfers the rotation force to the ball screw axis through a timing belt.

4. The scan and step exposure system according to claim 1, wherein a glass base is safely mounted on the mask holder, and a vacuum line is provided in dent on the bottom of the glass base along the rectangular periphery, and a plurality of vacuum ports are provided on the top of the glass base to be through and coupled with the vacuum line, and the film mask having circuit patterns thereon is fixed to in close contact with the bottom of the glass base.

5. The scan and step exposure system according to claim 4, wherein a plurality of centering lines are formed out of the vacuum line to meet and fix the center of the film mask to the glass base.

* * * * *